(12) United States Patent
Huang

(10) Patent No.: US 6,259,278 B1
(45) Date of Patent: Jul. 10, 2001

(54) PHASE DETECTOR

(75) Inventor: Chen-chih Huang, Hsinchu (TW)

(73) Assignee: Realtek Semiconductor Corp., Hsinchu (TW)

(*) Notice: Subject to any disclaimer, the term of this patent is extended or adjusted under 35 U.S.C. 154(b) by 0 days.

(21) Appl. No.: 09/332,067

(22) Filed: Jun. 14, 1999

(51) Int. Cl.[7] .................................................. G01R 25/00
(52) U.S. Cl. .......................... 327/12; 327/148; 327/7; 327/157
(58) Field of Search ........................... 327/5, 7, 12, 157, 327/148, 261, 263, 270

(56) References Cited

U.S. PATENT DOCUMENTS 5,592,519 * 1/1997 Honaker ........................ 375/373

* cited by examiner

Primary Examiner—Toan Tran
Assistant Examiner—Cassandra Cox
(74) Attorney, Agent, or Firm—Bacon & Thomas, PLLC

(57) ABSTRACT

The present invention provides a phase detector without dead zone, which can reduce clock jitter and provide higher tolerance for data random jitter. It can output a plurality of control signals (up,dn) through the function of a plurality of multi-phase clock signals to detect the transition edge of data signals. Therefore, the relation between the phase error $\theta_e$ and the voltage Vd of a phase-locked loop can be adjusted to be nearly linear dependent. In this way, the phase-locked loop in accordance with the present invention has no dead zone, clock jitter can be reduced and tolerance for data random jitter can be enhanced.

2 Claims, 6 Drawing Sheets

PHASE DETECTOR

FIELD OF THE INVENTION

The present invention relates generally to a phase detector, and more particularly, to a phase detector which can be utilized in a multi-phase-locked loop for data recovery.

BACKGROUND OF THE INVENTION

Due to the advancement in the network transmission technology and the demands in the installed base of the computer networks, the network data transmission rate in hardware environment has been increased. Therefore, it becomes more and more important to correctly recover data (clock signal).

Nowadays, a phase-locked loop is often utilized to recover data. During the data recovery process, usually the received data can be correctly recovered (read) by using a phase detector to synchronize the recovering clock and the received data at the receiving end. In other words, the phase detector plays a very important role in whether the data can be correctly recovered by a phase-locked loop.

As mentioned above, FIG. 1 illustrates a prior art phase-locked loop 1 for data recovery comprising a phase detector 11, a charge pump 12, a loop filter 13, and a voltage controlled oscillator 14. The phase detector 11 is used to receive a data (clock) signal from outside and a feedback clock signal $CK_{vco}$ from the voltage controlled oscillator 14. The phase detector 11 compares the two received signals, outputs a control signal up or dn according to the phase difference $\theta_e$ of the two received signals ($\theta_e = \theta_{data} - \theta_{clock}$). The control signal up or dn is used to control the charge pump 12. As shown in FIG. 2(a), when the transition edge of the data (clock) signal data leads the falling edge of the feedback clock signal $CK_{vco}$, the phase detector 11 outputs an up signal. On the other hand, as shown in FIG. 2(b), when the transition edge of the data (clock) signal data lags behind the falling edge of the feedback clock signal $CK_{vco}$, the phase detector 11 outputs a dn signal. The up and dn control signals outputted from the phase detector 11 control the charge/discharge operation of the charge pump 12. A voltage signal Vd is generated by the charge pump 12 according to the up and dn control signals. The loop filter 13 generates a voltage Vc for controlling the voltage-controlled oscillator 14. In accordance with the above-mentioned voltage Vc, the voltage-controlled oscillator 14 outputs a clock signal $CK_{vco}$ which is applied to the phase detector 11.

Referring to FIG. 3, the phase detector 11 of the phase-locked loop 1 is constituted by four flip-flops 111, 112, 113, 114, and two OR gates 115, 116. The flip-flops 111 and 112 receive the inverted data signal $\overline{data}$ from outside as well as the data itself, respectively. The clock signal $CK_{vco}$ from the voltage-controlled oscillator 14 is applied to the complementary reset terminals rb of the flip-flops 111 and 112 so as to output control signals up1 and up2, respectively. The flip-flops 113 and 114 are utilized to receive the complementary data signal $\overline{data}$ from outside and the data itself. The inverted signal of $CK_{vco}$ is applied to the complementary reset terminals rb of the flip-flops 113 and 114 so as to output control signals dn1 and dn2, respectively. According to the control signals up1 and up2, the OR gate 115 generates a control signal up (refer to FIG. 2(a)) for controlling the charge pump 12. Similarly, according to the control signals dn1 and dn2, the OR gate 116 generates a control signal dn (as shown in FIG. 2(b)) to control the charge pump 12.

Referring to FIG. 1, the voltage Vd is controlled by the two received signals (up, dn) of the charge pump 12. In other words, the variation of the control voltage Vd is related with the phase error $\theta_e$. FIG. 4 illustrates the relation between the variation of the voltage Vd and the phase error $\theta_e$. As shown in FIG. 4, when the data signal data has a phase lagging behind the clock signal $CK_{vco}$, the smaller the phase error $\theta_e$ is, the more the voltage Vd varies, which is contrary to our prediction. Theoretically, the phase error $\theta_e$ is supposed to approximate to zero and closely moves around the origin when a phase-locked loop nearly enter a phase-locked state. However, according to the above description, when the data signal data of a phase-locked loop has a phase lagging behind the clock signal $CK_{vco}$, a rapid variation of the voltage Vd will be generated, which induces clock jitter. Tolerance for data random jitter thus become worse. In other words, it is impossible to reduce the clock jitter utilizing the conventional phase detector 11, tolerance for data random jitter is thus hardly improved.

SUMMARY OF THE INVENTION

It is therefore an object of the present invention to provide a phase detector without dead zone. Clock jitter thus can be reduced and tolerance for data random jitter can be improved.

Another object of the present invention is to provide a phase detector without static phase error.

The present invention provides a phase detector which outputs a plurality of control signals ($up_i$'s and $dn_i$'s) by utilizing a plurality of multi-phase clock signals to detect the transition edge of the data signal. Therefore, the relation between the phase error $\theta_e$ in a phase-locked loop which utilizes the above-mentioned phase detector and the voltage Vd can be adjusted to be nearly linear dependent, a phase-locked loop without dead zone thus can be derived. Furthermore, clock jitter can be reduced and tolerance for data random jitter can be improved.

To achieve the aforementioned objects, the present invention provides a phase detector, comprising N phase detection units: $U_0, U_1, \ldots, U_{N-1}$, (N is even, $N \geq 4$) connected in cascade configuration. Each phase detection unit $U_j$ ($0 \leq j \leq N-1$) comprises an inverter, a first D flip-flop, an exclusive OR gate and a second D flip-flop. The inverter receives a clock signal $CK_j$. The first D flip-flop receives a common data signal data at its data input terminal and the output signal of the inverter at its inverting clock input terminal. The exclusive OR gate receives the output signal of the first D flip-flop and another input signal. The second D flip-flop receives the output signal of the exclusive OR gate at its data input terminal and the clock signal $CK_j$ at its inverting clock input terminal, and outputs a charge/discharge signal. The another input signal of the exclusive OR gate in the phase detection unit $U_j (0 \leq j \leq N-1)$ is the output signal of the first D flip-flop in the phase detection unit $U_{j+1(mod\ N)}$. The phase difference between the clock signal $CK_j (0 \leq j < N-1)$ and $CK_{j+1}$ is $2\pi/N$.

By using the phase detector in accordance with the present invention, the relation between the phase error $\theta_e$ in the phase-locked loop and the voltage Vd can be adjusted to be nearly linear by employing those control signals. Therefore, a phase-locked loop without dead zone can be derived, which can reduce clock jitter and improve the tolerance for data random jitter.

BRIEF DESCRIPTION OF THE DRAWINGS

The above and other objects and the features and effects of the present invention can be best understood by referring to the following detailed description of the preferred embodiment and the accompanying drawings, in which.

DETAILED DESCRIPTION OF THE PREFERRED EMBODIMENTS

Figure 5:
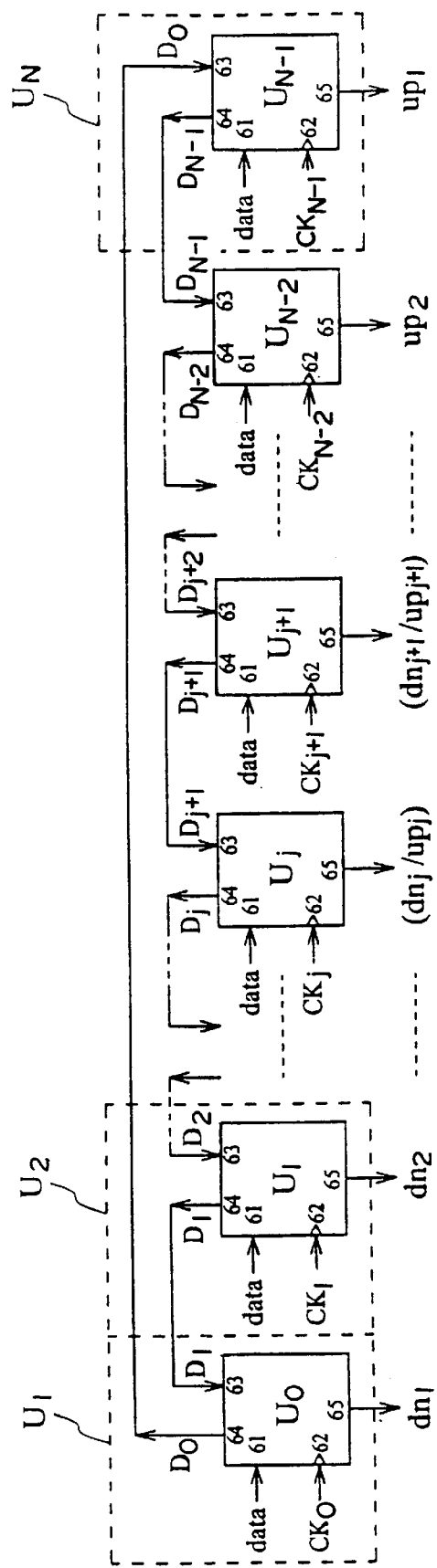
FIG. 5 is a block diagram illustrating the phase detector in accordance with the present invention.

Referring to FIG. 5, the phase detector is constituted by N phase detection units ($U_0$, $U_1$, ..., $U_{N-}$), wherein N is even and N≧4.

The phase detection units ($U_0$, $U_1$, ..., $U_{N-1}$) are connected in cascade configuration. Each phase detection unit contains: a data signal input terminal 61 for receiving a common data signal (data) from outside; a clock signal input terminal 62 for receiving a multi-phase clock signal $CK_0$, $CK_1$, ..., $CK_{N-1}$ from outside; a delay signal input terminal 63 for receiving a delay signal outputted from the next phase detection unit; a delay signal output terminal 64 for outputting a delay signal; and a charge/discharge control signal output terminal 65 for outputting charge/discharge control signals.

Each phase detection unit $U_j(0 \leq j \leq N-1)$ generates a delay signal $D_i(1 \leq i \leq N)$ according to the data signal data applied to the phase detection unit, and the inverted signal of the multi-phase clock signal $CK_j$. Besides, the delay signal $D_{j+1(Mod\ N)}$ generated by the phase detection unit $U_{j+1(Mod\ N)}$ is applied to the $j_{th}$ phase detection unit $U_j$ via the delay signal input terminal 63 thereof.

The $j_{th}$ phase detection unit $U_j(0 \leq j \leq -1)$ integer) generates a control signal for charge/discharge operation according to the delay signal $D_j$ generated by the phase detection unit $U_j$, the delay signal generated by the phase detection unit $U_{j+1(Mod\ N)}$, as well as the multi-phase clock signal $CK_j$ which is applied to the $j_{th}$ phase detection unit $U_j$. The phase difference between the two clock signals $CK_j$ and $CK_{j+1(mod\ N)}$ is $2\pi/N$.

Figure 6:
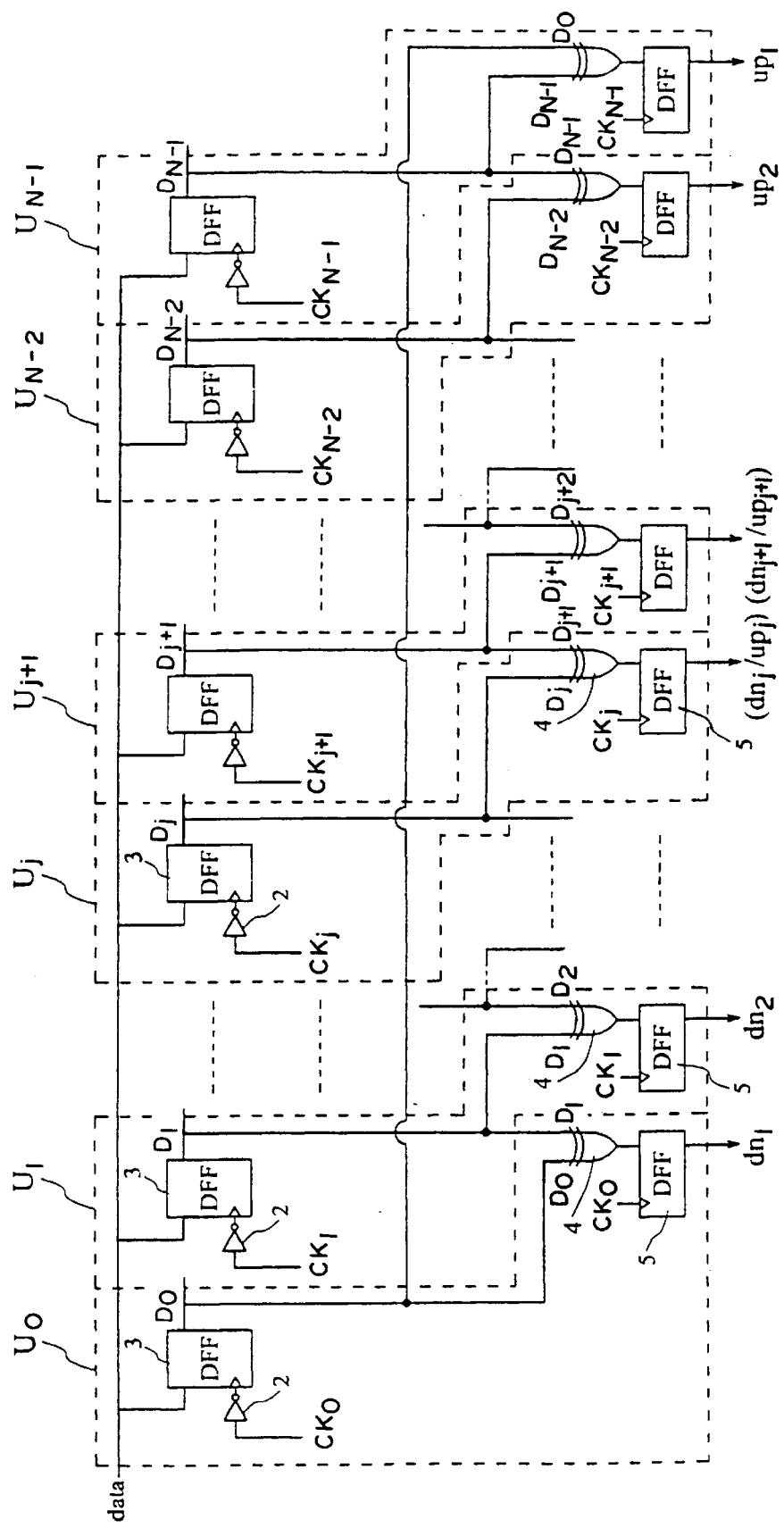
FIG. 6 is a detailed circuit diagram showing an implementation of the phase detector of FIG. 5.

The detailed phase detector in accordance with the invention can be implemented by the circuit diagram shown in FIG. 6.

As shown in FIG. 6, each phase detection unit $U_j(0 \leq j \leq -1)$ of the phase detector in accordance with the invention includes: an inverter 2, a first flip-flop 3, an exclusive OR gate 4, and a second flip-flop 5. The inverter 2 receives the multi-phase clock signal $CK_j(0 \leq j \leq N-1)$, its output is then applied to the first flip-flop 3.

The first flip-flop 3 generates a delay signal $D_j(0 \leq j \leq -1)$ according to a common data signal data, and the inverted multi-phase clock signal $CK_j$.

The delay signal $D_j$ generated by the first flip-flop 3 in the phase detection unit $U_j$ and the delay signal $D_{j+1(mod\ N)}$ generated by the first flip-flop 3 in the phase detection unit $U_{j+1(mod\ N)}$ are sent to the two input terminals of the exclusive OR gate 4.

The second flip-flop 5 in the phase detection unit $U_j$ generates a charge/discharge control signal according to the above-mentioned multi-phase clock signal $CK_j$ and the signal outputted from the exclusive OR gate 4.

In addition, the first flip-flop and the second flip-flop in each phase detection unit are D flip-flops.

From the above description, the phase detector in accordance with the invention utilizes a plurality of multi-phase clock signals to detect the transition edge of a data signal, and a plurality of control signals are generated. The relation between the phase error $\theta_e$ and voltage Vd can be adjusted to be nearly linear dependent. In this way, the phase-locked loop utilizing the phase detector in accordance with the present invention has no dead zone, clock jitter thus can be reduced, and the tolerance for data random jitter can be improved.

An practical example is described below to illustrate in more detail.

EXAMPLE

The example described below includes ten phase detection units ($U_0$, $U_1$, ..., $U_9$) in the phase detector.

Figure 7:
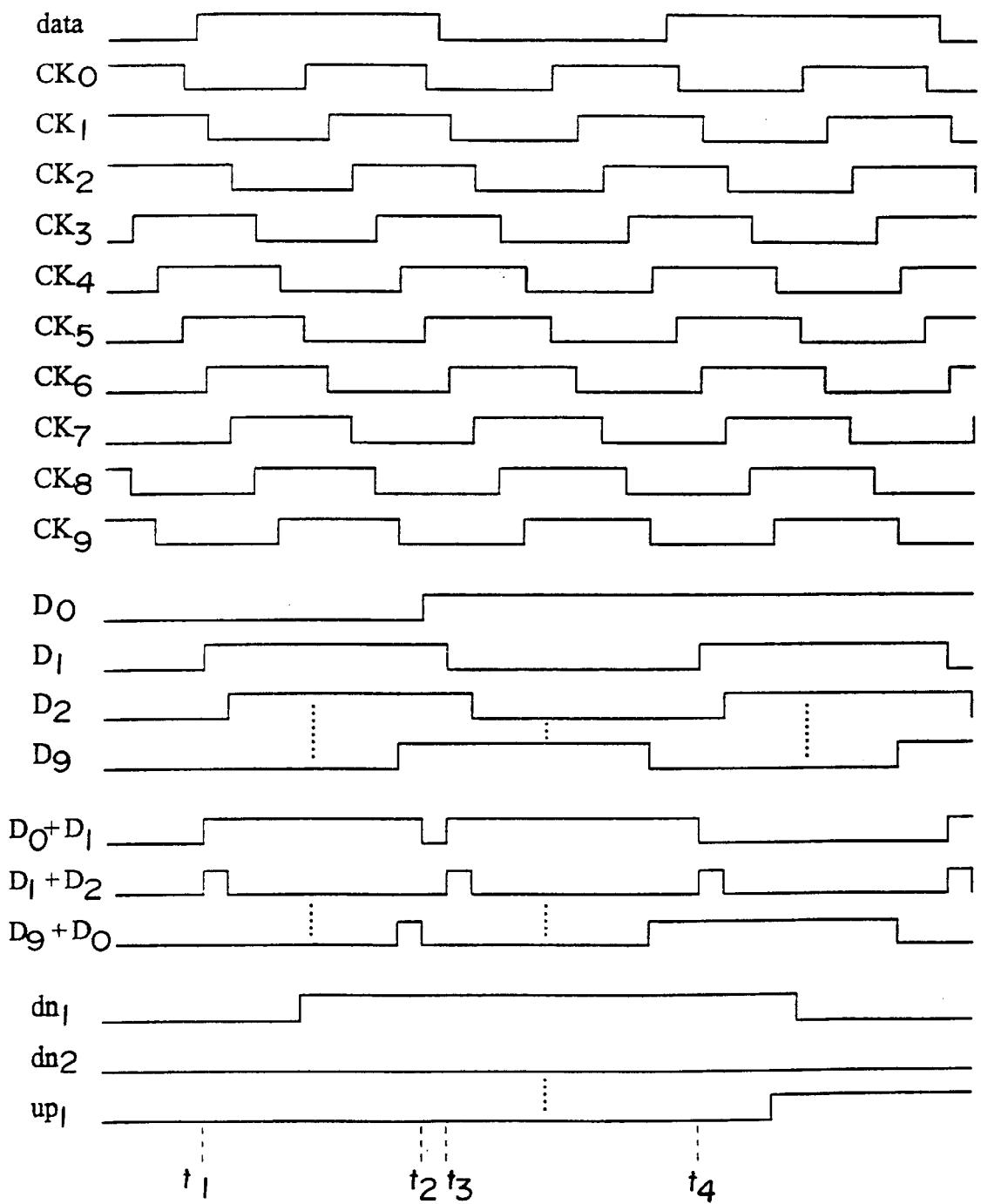
FIG. 7 is a timing diagram showing the signals of data signal data, the multi-phase clock signals $CK_0$, $CK_1$, ..., $CK_9$, as well as the charge/discharge control signals (up/dn), which are employed in the present invention.

Referring to FIG. 6, when each phase detection unit $U_j(0 \leq j \leq 9)$ receives the input data signal data shown in FIG. 7 and the multi-phase clock signals $CK_j$, the flip-flop 3 in the first phase detection unit $U_0$ outputs a delay signal $D_0$, the first flip-flop 3 in the phase detection unit $U_1$ outputs a delay signal $D_1$, and the first flip-flop 3 in the phase detection unit $U_2$ outputs a delay signal $D_2$, and the like.

As described above, the delay signal $D_0$ generated by the phase detection unit $U_0$ and the delay signal $D_1$ generated by the phase detection unit $U_1$ cooperatively generate an output signal ($D_0 \oplus D_1$) through the exclusive OR gate 4 in the phase detection unit $U_0$. Similarly, the delay signal $D_1$ generated by the phase detection unit $U_1$ and the delay signal $D_2$ generated by the phase detection unit $U_2$ cooperatively generate an output signal ($D_1 \oplus D_2$) through the exclusive OR gate 4 in the phase detection unit $U_1$. The delay signal $D_9$ generated by the phase detection unit $U_9$ and the delay signal $D_0$ generated by the phase detection unit $U_0$ cooperatively generate an output signal ($D_9 \oplus D_{10}$) through the exclusive OR gate 4 in the phase detection unit $U_9$.

As described in the preceding paragraph, the second flip-flop 5 in the phase detection unit $U_0$ generates a discharge control signal $dn_1$ according to the multi-phase clock signal $CK_0$ and the output signal ($D_0 \oplus D_1$) from the exclusive OR gate 4. Similarly, the second flip-flop 5 in the phase detection unit $U_1$ generates a discharge control signal $dn_2$ according to the multi-phase clock signal $CK_1$ and the output signal ($D_1 \oplus D_2$) from the exclusive OR gate 4. Besides, the second flip-flop 5 in the phase detection unit $U_9$ generates a charge control signal $up_1$ according to the multi-phase clock signal $CK_9$ and the output signal ($D_9 \oplus D_0$) from the exclusive OR gate 4. It should be mentioned that the phase difference between two consecutive multi-phase clock signals ($CK_0$, $CK_1$, ..., $CK_9$) is $2\pi/10$, the phase detection unit ($U_0$, $U_1$, ..., $U_9$) in the phase detector altogether generate five discharge control signals ($dn_1$, $dn_2$, $dn_3$, $dn_4$, $dn_5$) and five charge control signals ($up_1$, $up_2$, $up_3$, $up_4$, $up_5$) in this example.

Figure 8:
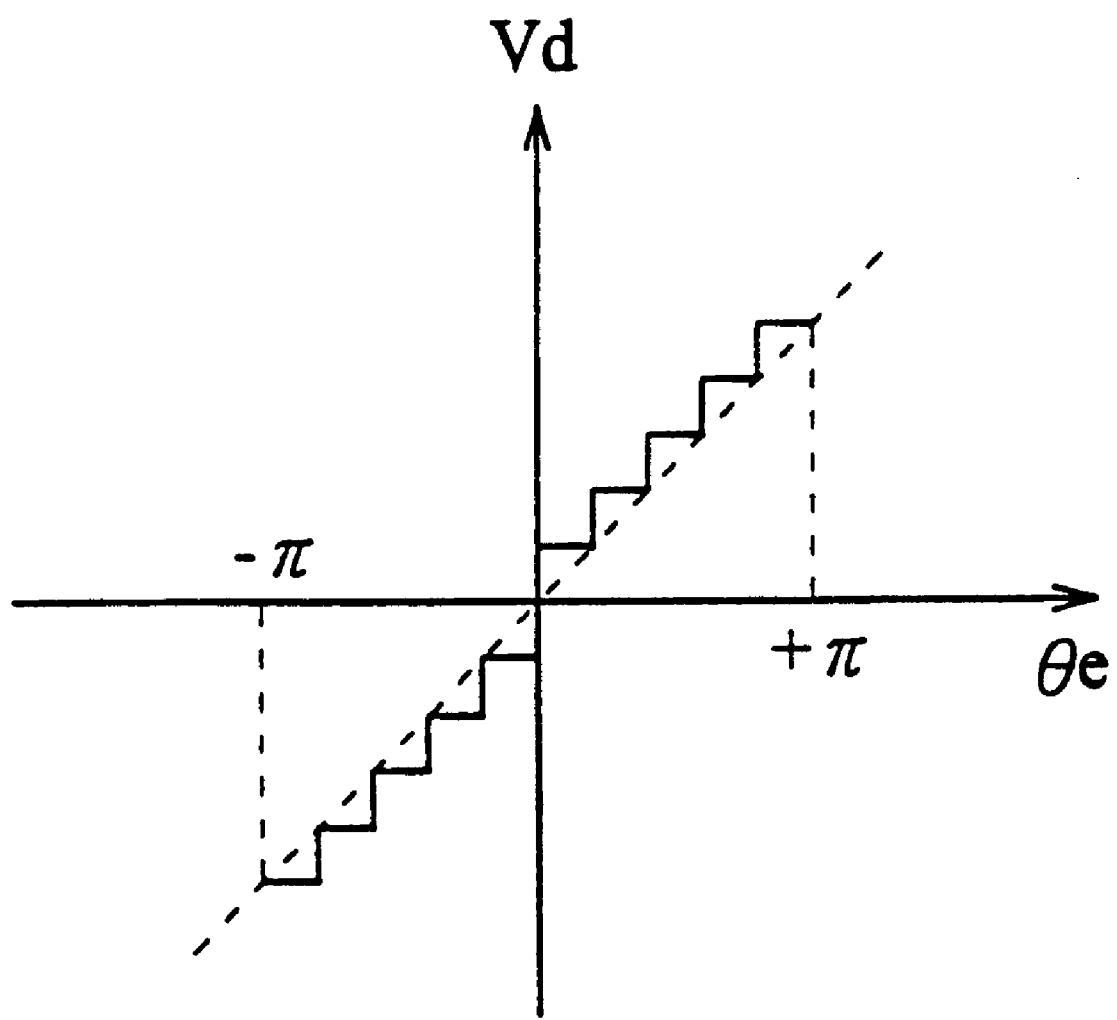
FIG. 8 depicts the relation between the phase error $\theta_e$ and the voltage Vd in the phase detector in accordance with the present invention.

From the description in the preceding paragraph, it is understood that a plurality of charge/discharge control signals (up/dn) can be generated by the phase detector in accordance with the invention. If the phase detector is incorporated in a phase-locked loop, the charge pump which receives the output signals of the phase detector will output a smaller current value $I_{ch}$ when the phase error $\theta_e$ is small. On the other hand, it will output a larger current value $I_{ch}$ when the phase error $\theta_e$ is large. The example using the above-mentioned method is as below:

$$I_{ch}(t) = \{[w_1 \times up_1(t) + w_2 \times up_2(t) + w_3 \times up_3(t) + w_4 \times up_4(t) + w_5 \times up_5(t)] - [w_1 \times dn_1(t) + w_2 \times dn_2(t) + w_3 \times dn_3(t) + w_4 \times dn_4(t) + w_5 \times dn_5(t)]\} Iss,$$

wherein $I_{ch}(t)$ represents the total charge/discharge current of charge pump at time t, Iss represents a fixed current value, and $w_1 \sim w_5$ represent the weighting value under the restriction $w1 < w2 < w3 < w4 < w5$. Using these control signals, the relation between the phase error $\theta_e$ and the voltage Vd in a phase-locked loop can be adjusted to be nearly linear dependent(as shown in FIG. 8).

Figure 1:
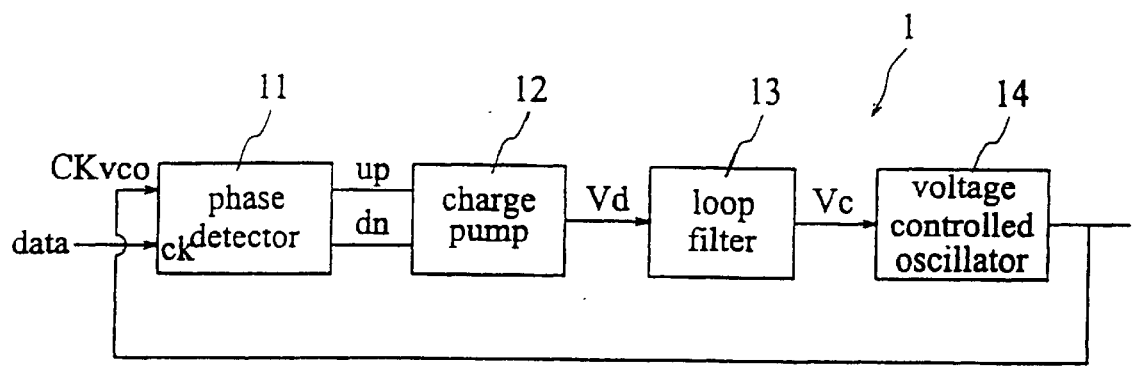
FIG. 1 is a block diagram showing a prior phase-locked loop for data recovery.
Figure 2A:
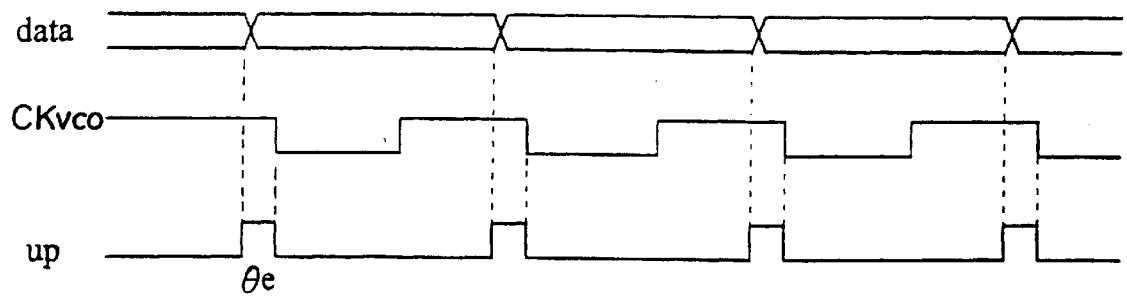
FIG. 2(a) is a timing diagram illustrating the control signal (up) generated by a prior art phase detector when the transition edge of data signal data leads the falling edge of the clock signal $CK_{vco}$.
Figure 2B:
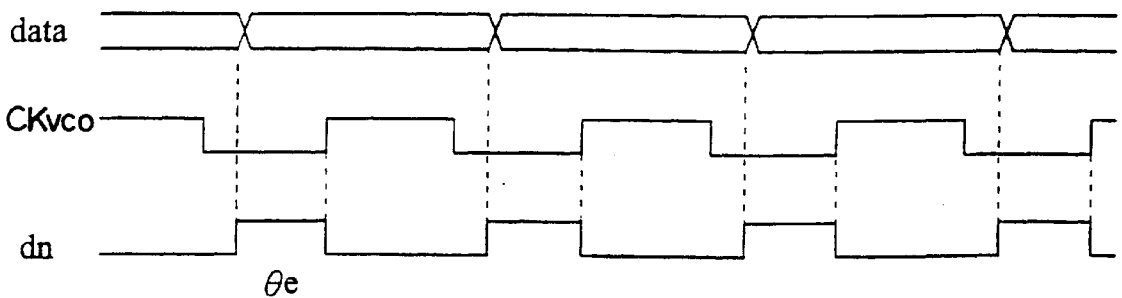
FIG. 2(b) is a timing diagram illustrating the control signal (dn) generated by a prior art phase detector when the transition edge of data signal data lags behind the falling edge of the clock signal $CK_{vco}$.
Figure 3:
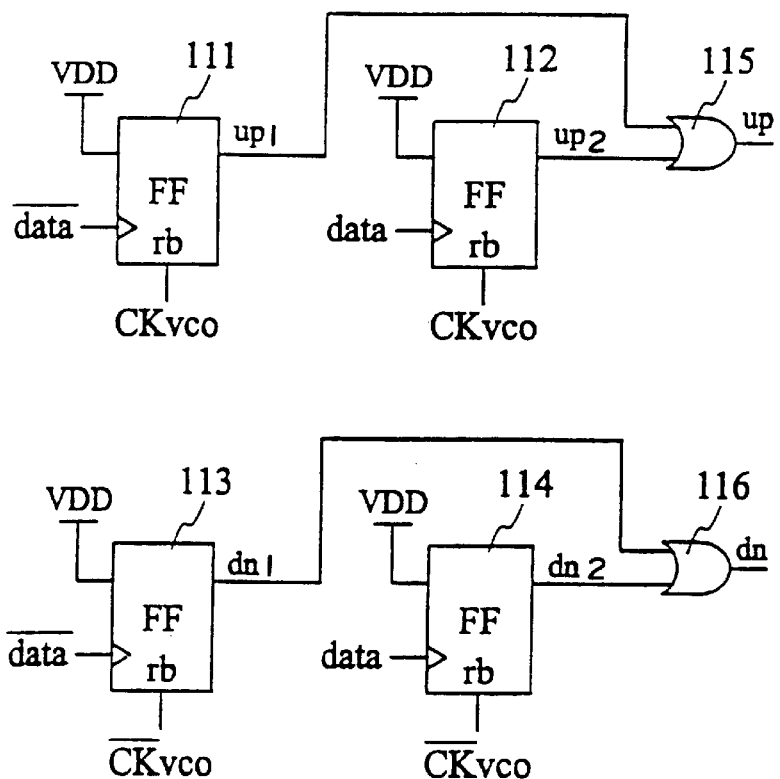
FIG. 3 is a circuit showing a prior art phase detector.
Figure 4:
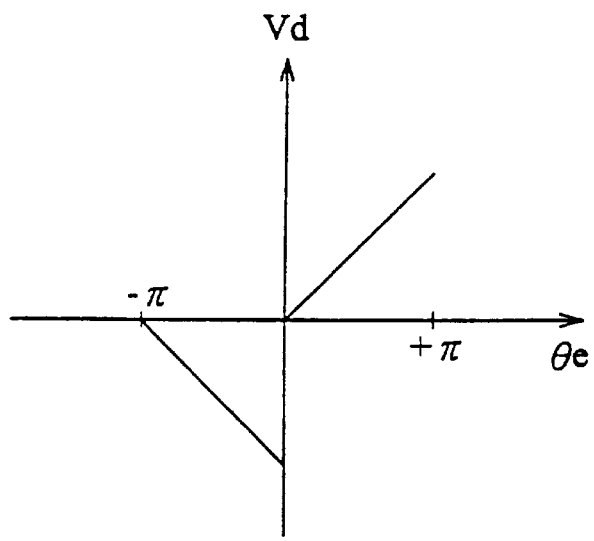
FIG. 4 depicts the relation between the phase error $\theta_e$ and voltage Vd by using the prior art phase detector as shown in FIG 3.

To sum up, the phase detector in accordance with the present invention provides the following advantages:

1. Referring to FIG. 8, it can be understood that the dead zone can be avoided because the phase detector in accordance with the invention has fixed time period for all up/dn. Therefore, the up or dn signal having sufficient length can be generated even the phase error $\theta_e$ is very small.
2. Due to the nearly linear relation between $V_d$ and $\theta_e$, the situation of instantaneous voltage change as illustrated in FIG. 4 can be avoided. Therefore, lower recovering clock jitter can be derived.
3. Higher tolerance for data random jitter due to the lower recovering clock jitter can be derived as well by the phase detector in accordance with the invention.
4. If the conventional phase-locked loop as illustrated in FIG. 1 is used to perform data recovery, one additional flip-flop needs to be incorporated such that data can be recovered in a phase-locked state. Therefore, the problems such as device coupling, parasitic capacitance and delay effects cannot be avoided, which is called static phase error. By using the phase detector in accordance with the invention, it is unnecessary to incorporate additional flip-flop to recover the data in a phase-locked state as the conventional phase-locked loop does.

The preferred embodiment described in the above description are only illustrative and are not to be construed as limiting the invention. Various modifications and applications can be made without departing from the true spirit and scope of the invention as defined by the appended claims.

What is claimed is:

1. A phase detector, comprising N phase detection units: $U_0, U_1, \ldots, U_{N-1}$, wherein N is even and $N \geq 4$, said N phase detection units being connected in cascade configuration, each phase detection unit $U_j(0 \leq j \leq N-1)$ comprising:

an inverter arranged to receive a clock signal $CK_j$;

a first D flip-flop arranged to receive a common data signal data at its data input terminal and the output signal of said inverter at its inverting clock input terminal;

an exclusive OR gate arranged to receive the output signal of said first D flip-flop and another input signal; and a second D flip-flop arranged to receive the output signal of said exclusive OR gate at its data input terminal and the clock signal $CK_j$ at its inverting clock input terminal, and to output a charge/discharge signal, wherein said another input signal of said exclusive OR gate in the phase detection unit $U_j(0 \leq j \leq N-1)$ is the output signal of the first D flip-flop in the phase detection unit $U_{j+1(mod\ N)}$, and wherein a phase difference between the clock signals $CK_j(0 \leq j < N-1)$ and $CK_{j+1}$ is $2\pi/N$.

2. A phase detector for a phase-locked loop having a phase detector, a charge pump, a loop filter and a voltage controlled oscillator, the phase detector comprising N phase detection units: $U_0, U_1, \ldots, U_{N-1}$, wherein N is even and $N \geq 4$, said N phase detection units being connected in cascade configuration, each phase detection unit $U_j(0 \leq j \leq N-1)$ comprising:

an inverter arranged to receive a clock signal $CK_j$;

a first D flip-flop arranged to receive a common data signal data at its data input terminal and the output signal of said inverter at its inverting clock input terminal;

an exclusive OR gate arranged to receive the output signal of said first D flip-flop and another input signal; and a second D flip-flop arranged to receive the output signal of said exclusive OR gate at its data input terminal and the clock signal $CK_j$ at its inverting clock input terminal, and to output a charge/discharge signal, wherein said another input signal of said exclusive OR gate in the phase detection unit $U_j(0 \leq j \leq N-1)$ is the output signal of the first D flip-flop in the phase detection unit $U_{j+1(mod\ N)}$, wherein the phase difference between the clock signal $CK_j(0 \leq j > N-1)$ and $CK_{j+1}$ is $2\pi/N$; and wherein the charge/discharge current in the charge pump is determined by the charge/discharge signals generated by all the N phase detection units.

* * * * *